United States Patent [19]
Hager

[11] 3,989,164
[45] Nov. 2, 1976

[54] MAGNETIC HANDLING EQUIPMENT
[75] Inventor: Georg Hager, Denzlingen, Germany
[73] Assignee: ITT Industries, Inc., New York, N.Y.
[22] Filed: May 29, 1975
[21] Appl. No.: 582,018

[30] Foreign Application Priority Data
June 8, 1974 Germany............................ 2427755

[52] U.S. Cl................................ 221/212; 198/619
[51] Int. Cl.².......................................... B23Q 7/16
[58] Field of Search................... 209/73, 74, 81; 221/212; 198/41

[56] References Cited
UNITED STATES PATENTS

| | | |
|---|---|---|
| 3,120,890 | 2/1964 | Walz................................. 198/41 X |
| 3,263,796 | 8/1966 | Parke..................................... 198/41 |
| 3,353,822 | 11/1967 | Dangelmaier et al................. 198/41 |
| 3,388,795 | 6/1968 | Bereset et al......................... 209/73 |
| 3,692,168 | 9/1972 | Hughes et al......................... 198/41 |
| 3,741,436 | 6/1973 | Hartline et al...................... 221/212 |
| 3,753,513 | 8/1973 | Grenfell et al...................... 221/212 |

Primary Examiner—Allen N. Knowles
Attorney, Agent, or Firm—John T. O'Halloran; Peter Van der Sluys; Vincent Ingrassia

[57] ABSTRACT

For the handling, especially sorting, of devices which at least partly consist of a ferromagnetic material, at least one switchable electromagnet in a fixed position produces an electromagnetic field which penetrates a first steady magnetic field and is dimensioned and timely switched according to the special handling process to be performed.

10 Claims, 10 Drawing Figures

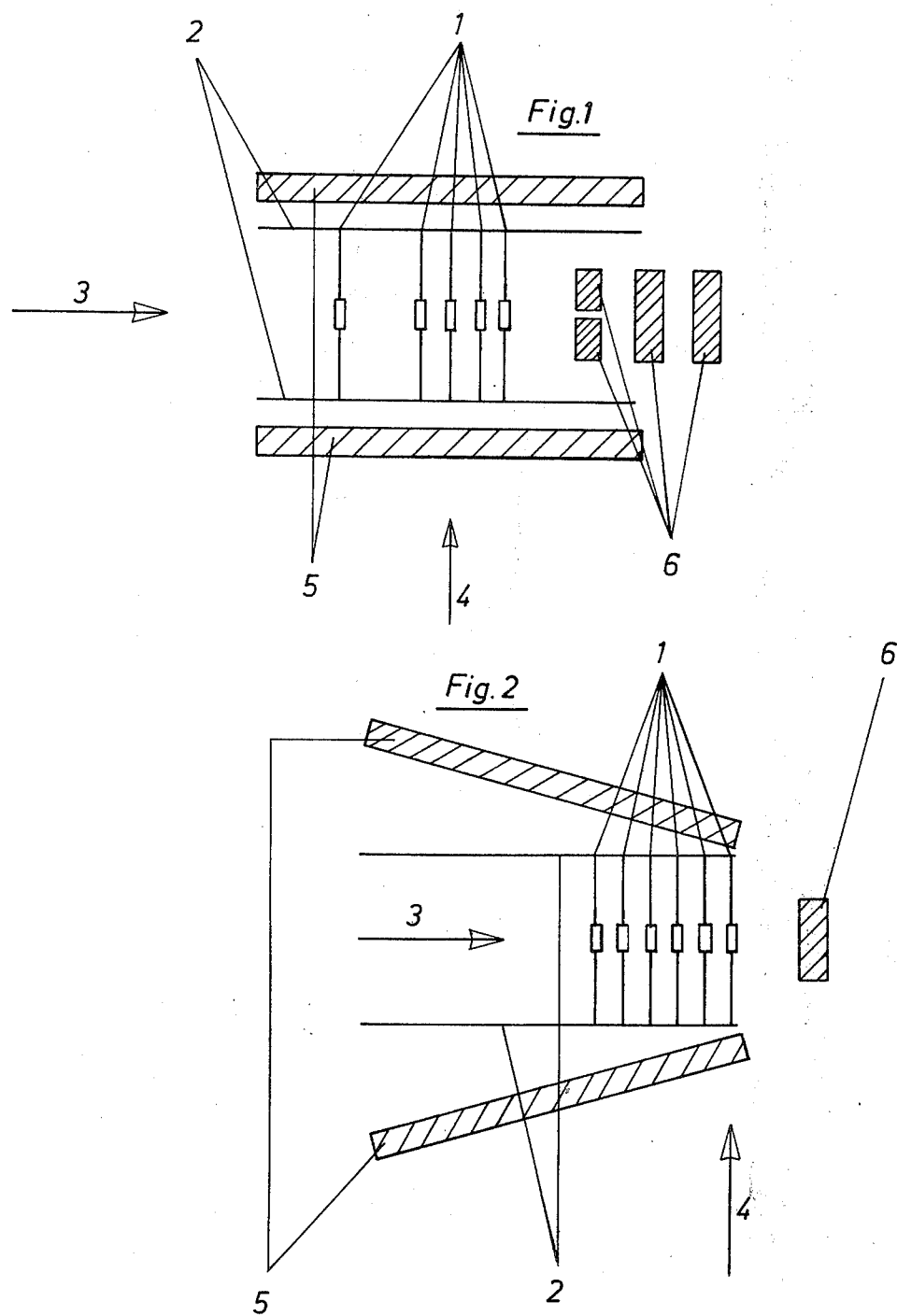

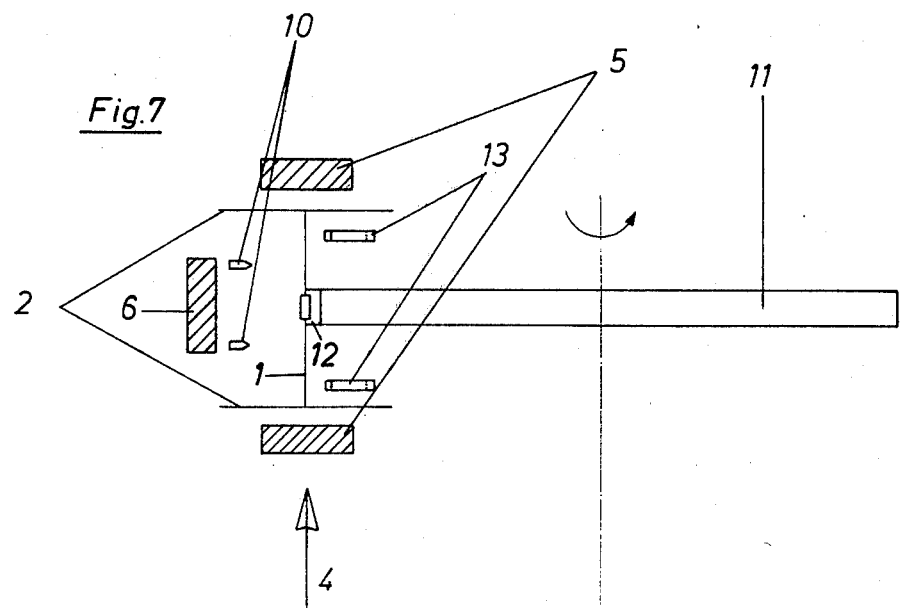
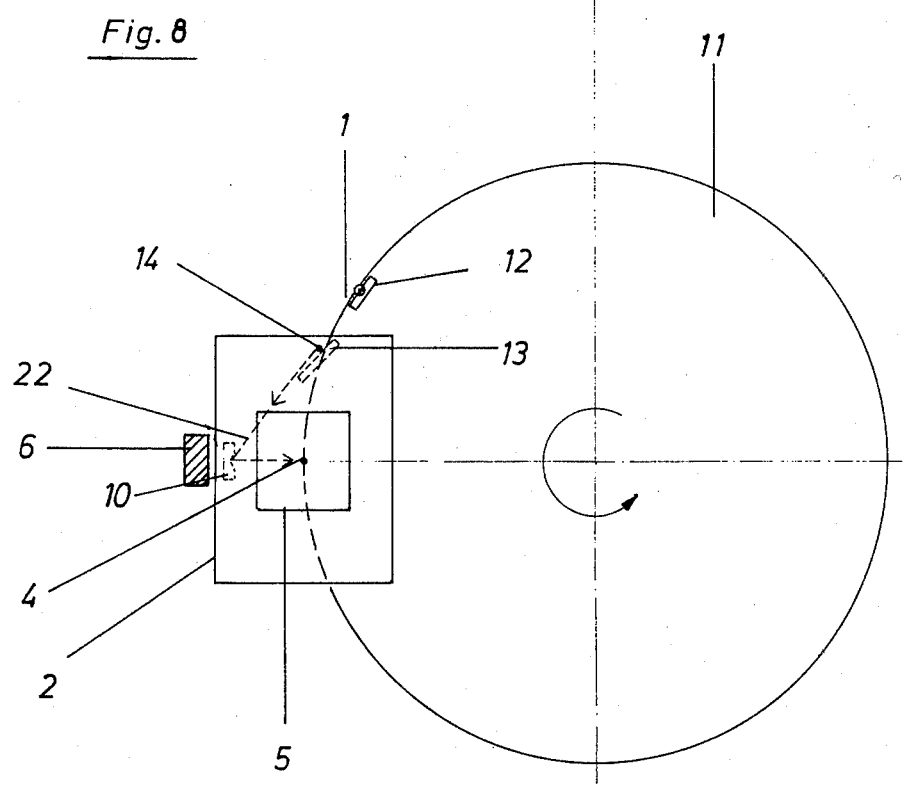

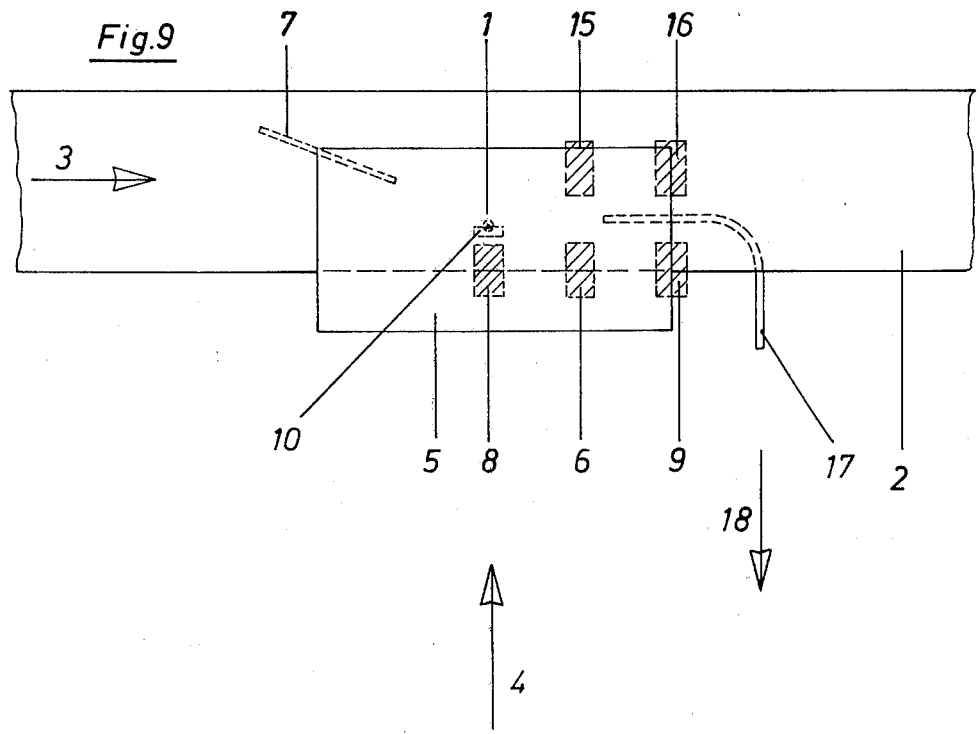
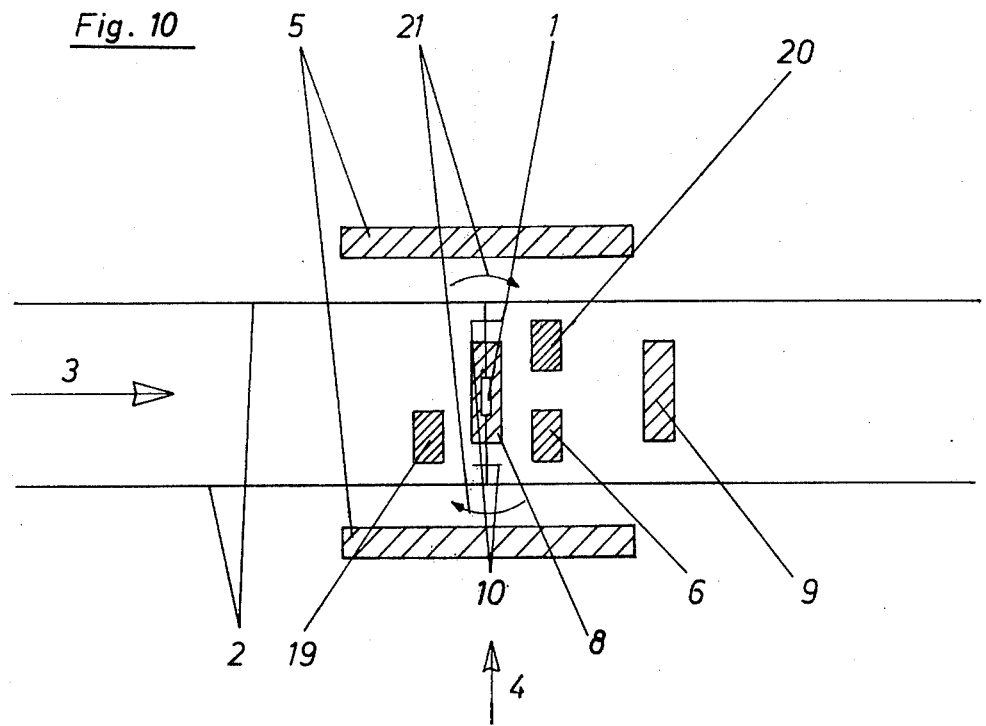

MAGNETIC HANDLING EQUIPMENT

BACKGROUND OF THE INVENTION

For the handling of devices which at least partly consist of a ferromagnetic material, the use of magnetic fields results in more speedy operation and fewer wear problems than conventional mechanical systems.

The invention relates generally to an apparatus for handling devices which at least partly consist of a ferromagnetic material and more particularly wherein said devices are guided by means of two sliding surfaces having a spaced parallel relation and which are penetrated by the lines of force of a magnet arrangement serving as the source of a static magnetic field. The field strength of this magnetic field has a maximum value along the sliding surfaces in the direction of transportation of the devices. Such equipment is known from the U.S. Pat. No. 3,581,889.

In this conventional equipment, permanent magnets are provided as the means for transporting the devices, with the permanent magnets being mounted to the circumference of a transporting wheel coupled to a stepping motor. This requires a considerable mechanical investment and is subjected to wear.

SUMMARY OF THE INVENTION

It is an object of the present invention to provide a handling device which requires no movably guided transporting means.

According to a broad aspect of the invention, there is provided an apparatus for handling devices consisting in part of a ferromagnetic material comprising: sliding means for guiding said devices; a first magnet arrangement producing a first steady inhomogeneous magnetic field whose intensity has a maximum value along the sliding means in the transporting direction and whose lines of force penetrate said sliding means generally vertically in relation to a surface of said sliding means; a switch; and at least one geometrically firmly arranged transporting electromagnet controlled by said switch and producing a second inhomogeneous magnetic field which overlaps said first magnetic field of said first magnet arrangement, said electromagnet capable of being switched in relation to time in such a way that said devices, when correspondingly dimensioning the magnet field and subsequent to their insertion on said sliding means, can be geometrically affected by said transporting electromagnet.

The equipment according to the invention is preferably used for the handling of electronic devices, particularly diodes, transistors, and integrated circuits. It is also suitable, however, for handling small mechanical parts, such as screws, needles, etc.

The magnet arrangement in the equipment according to the invention is preferably composed of two permanent-magnetic plates between which the devices are guided by means of the switchable transporting magnets using guide means designed as sliding surfaces. Depending on the arrangement of the individual components of the equipment in relation to one another, the devices may be geometrically fixed, if necessary linked to a rotation or turn about at least one of their axes, as well as transported further out of the range of the equipment either individually or in certain quantities, i.e., separated or singled out.

When using the equipment for the singling-out or sorting purpose, a device storage in an apparatus according to the invention can be realized in that the magnet arrangement is preferably realized in the form of two magnet plates arranged at an acute angle in relation to one another, so that the magnetic field will first of all be increased considerably in the direction of transportation of the devices and, after a maximum value at the end of the sliding surface, will considerably decrease. Accordingly, the devices accumulate at the end of the sliding surfaces. For serving as the source of a second inhomogeneous magnetic field, at least one switchable transporting magnet of such structure and intensity is arranged in a geometrically fixed manner at the end of the sliding surfaces. By weakening the second inhomogeneous magnetic field below a value necessary for the pulling off of further devices, at least one device can be pulled off from the end. By suitably fixing the position of the one or more transporting magnets in relation to the end of the sliding surfaces it will become possible, by correspondingly selecting the time position and the duration of switching on one or more transporting magnets, to move the devices past the transporting magnet in the transporting direction. In this way the devices will be separated or singled out.

The singling out effect may still be improved by providing for a further guiding surface arranged at an acute angle in relation to the transporting direction. In the same sense, a switchable hold magnet for serving as the source of a further inhomogeneous magnetic field may be provided for in such an arrangement in relation to the sliding surfaces. In such a design, upon energization, the flow of devices is interrupted at the point of the hold magnet, thus permitting transportation of the devices in the switching rhythm of the hold magnet. This enables a temporary measurement or processing to be carried out.

In further embodying the equipment according to the invention, and especially for the sorting purpose, it is possible to realize deflecting arrangements in such a way that at least two rows of switchable transporting magnets are provided for, each of which is connected to a switch of a switching arrangement. The switching arrangement is designed to enable the time position and the switch-on period of the transporting magnets to be fixed in such a way that the latter, in accordance with the signals produced by the switching arrangement, will be controllably given a transporting direction along one of the rows of these switchable transporting magnets.

For effecting a spatial or geometric alignment of the devices between the sliding surfaces into a certain one of several possible extreme magnetizing directions, it is moreover possible to provide for an aligning arrangement consisting of a plurality of rotary or moving magnets capable of being individually switched each time one switch of a switching arrangement. By selecting the time position and the switch-on period of the switches, the individual magnetic fields of the rotary magnets are caused to overlap one another in such a way that the devices can be aligned in a certain direction.

During transportation it is possible to do without the static field of the magnet arrangement temporarily and locally, by arranging along the transportation path of the devices, bodies of such shape and arrangement that at least one additional force is exerted upon the devices by making use of gravity.

The above and other objects and features of the present invention will be more clearly understood from the following detailed description taken in conjunction with the accompanying drawings, in which:

BRIEF DESCRIPTION OF THE DRAWINGS

FIG. 1 shows an embodiment of the equipment according to the invention employing one pair of magnet plates and stationary transporting magnets;

FIG. 2 shows an embodiment for effecting the singling out (separation) of the devices;

FIG. 7 is a side view, and FIG. 8 is a top view of equipment according to the invention comprising one hold magnet for temporarily measuring or processing temporarily fixed or stationary devices;

FIG. 9 is a side view, for explaining an equipment according to the invention comprising a deflector, and FIG. 10 is a top view, showing a device for effecting the geometric alignment of the devices.

DESCRIPTION OF THE PREFERRED EMBODIMENT

Figure 3:
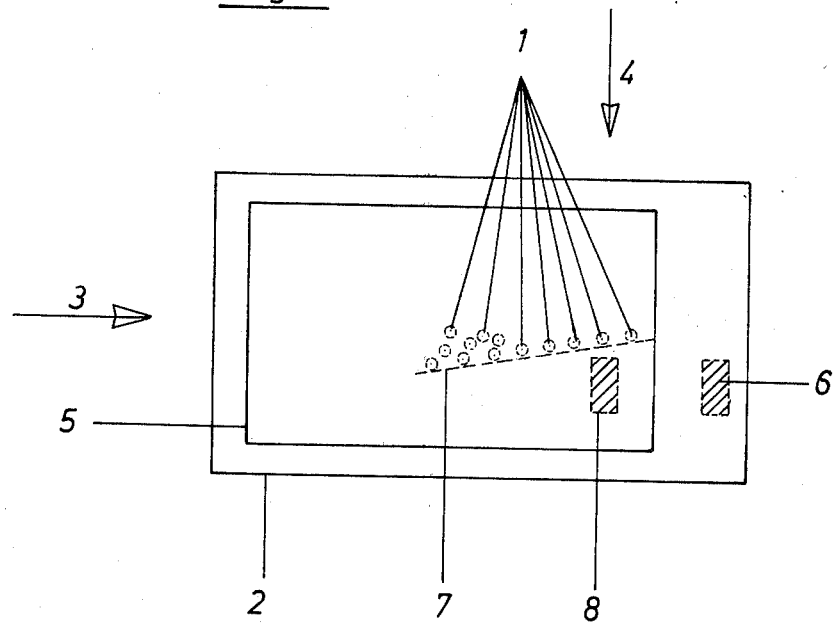
FIG. 3 is a side view.

The basic embodiment of the invention according to FIG. 1 contains a magnet arrangement for producing a static inhomogeneous magnetic field whose field intensity, in the transporting direction 3 of the devices, increases to a considerable extent and, after having reached a maximum value in FIG. 1 at point 4, again decreased considerably, which magnetic field is caused preferably by permanent magnets, i.e. in FIG. 1 by the two magnet plates 5 substantially magnetized in the same direction. The lines of flux within the space between the magnet plates 5 extend substantially vertically in relation to the magnet plates 5, so that the devices 1, in this case diodes, are aligned in one of their possible extreme magnetizing directions and stored chiefly within the range 4 of maximum field intensity. Further, the basic embodiment contains a mechanical arrangement for guiding these devices which, in the most simple case, consists of non-magnetic sliding surfaces 2 chiefly extending parallel in relation to one another and vertically in relation to the lines of force of the static magnetic field for effecting both the alignment and the motion of the devices 1.

At least one transporting magnet 6 produces a magnetic field which is preferably constant during the switch-on period, geometrically over-lapping the static magnetic field and having either an accelerating or retarding effect upon the devices 1. The transporting magnets 6, quite depending on the purpose of their practical application, may either consist of a simple air-cored coil or else of coils with a ferromagnetic core and correspondingly shaped pole shoes.

In some practical applications of the equipment according to the invention, the aligning and holding effect of the static inhomogeneous magnetic field upon the devices 1 may be achieved in another way. When placing the devices 1 or also only one single device onto a sliding surface provided with a correspondingly designed recess, the devices will be brought by the effect of gravity into this recess and, consequently, into a stable position of equilibrium to which they will always again return if not deflected too much, thus resembling the conditions in the inhomogeneous magnetic field. By correspondingly designing this recess in the sliding surface or, more generally speaking, by any suitable body placed in the path of transportation of the devices, the latter may also be aligned by exerting an additional force by utilizing the force of gravity. Thus, for example, a rod- or bar-shaped device, such as a diode, placed on a sliding surface provided with a channel-groove recess, will be preferably aligned in parallel with the channel groove and will reach the lowest point therein. Thus, the static inhomogeneous magnetic field as produced by the magnet plates 5, can be replaced in its effect by a correspondingly designed sliding surface for the devices.

For the purpose of realizing a desired handling function, for example the singling out, separation, sorting, etc., the individual components of the basic type of embodiment of the equipment can be associated in a suitable way with one another. Both the switching-on time position and the switch-on period (turn-on time) of the transporting magnets 6, as well as the intensity of the magnetic field as produced thereby, are in such a way incorporated in a temporal switch-on program of all transporting magnets 6 of the equipment in accordance with the geometrical layout in relation to the magnet arrangement 5, that by taking into consideration both the mass and the moment of inertia of the devices 1, there will be achieved a certain motional process in the course of which the devices 1 are either moved into the equipment, geometrically fixed within this equipment, if necessary, by being linked to a turning or rotation of the devices 1, or in the course of their further transportation are moved out of the equipment.

The following is a description of some examples of embodiment relating to the equipment according to the invention for performing various handling functions on the devices to be handled. In particular, these functions are as follows:

1. Coarse Singling (separation)
2. Fine Singling (separation)
3. Transporting with Fixing
4. Fixing
5. Sorting
6. Geometrical Alignment 1. Coarse Singling (Separation)

An apparatus for effecting the coarse singling will now be described with reference to FIG. 2 as a variation of FIG. 1. This drawing shows the preferred embodiment in a top view.

A larger number of devices 1, which in this particular case are diodes, are retained in a magnetically aligned manner in a strong inhomogeneous magnetic field as produced by a magnet arrangement serving as the supply storage. The inhomogeneous magnetic field, in the equipment according to FIG. 1, is produced by magnet plates 5. For the storing of the devices 1, magnet plates 5 are slanted in such a way that the field intensity will continuously increase in the transporting direction indicated by the arrow 3. In this way, the devices 1 are automatically transported in the direction of the higher field intensity towards the transporting end 4, i.e. the actual point of singling out. In so doing, they are moved between the sliding surfaces 2 of non-magnetic guide plates and accumulate at the end 4 of the sliding surfaces 2, because at this point the field intensity in the transporting direction 3 decreases considerably.

At a certain spaced relation from the transporting end 4, preferably in the transporting direction 3, a transporting magnet 6 is arranged in a geographically fixed manner. This transporting magnet 6 which is designed as an electromagnet, produces a correspondingly designed inhomogeneous magnetic field exerting a stronger force upon the devices 1 at the transporting end 4 than the magnetic field produced by the magnet plates of the magnet arrangement 5. On account of this, a certain number of devices are moved towards the transporting magnet 6. Upon approaching the transporting magnet 6, they effect a decrease of the stray field of the transporting magnet 6 which is effective at the transporting end 4, to such an extent that no further devices 1 can follow from the transporting end 4.

By correspondingly dimensioning the transporting magnet 6 as regards its field intensity and the geometric design of the magnetic field, e.g. by shaping the pole shoes in accordance with requirements in the case of an electromagnet having a ferromagnetic core, it is possible that only a certain number of devices 1, hence in critical cases also one individual device 1, is moved from the transporting end 4 towards the transporting magnet 6, and is thus singled out of the bulk of devices 1.

In the course of this singling process, the magnetic field of the transporting magnet 6, after having been switched on, is appropriately maintained until the devices 1 which are to be singled out, have been given a sufficient acceleration by the transporting magnet 6. The devices are given the greatest acceleration when the magnetic field is maintained until the device 1 has reached the point of maximum field intensity. When switching off the transporting magnet 6 at this time position, the devices 1 owing to the previously received acceleration, are moved at high speed in excess of the transporting magnet 6 and may thus be fed to a point of further processing. Accordingly, it is possible in this way to single out a certain number of devices 1 in a simple manner by providing for a corresponding timed excitation pulse for the transporting magnet 6.

2. Fine Singling (Separation)

Figure 4:
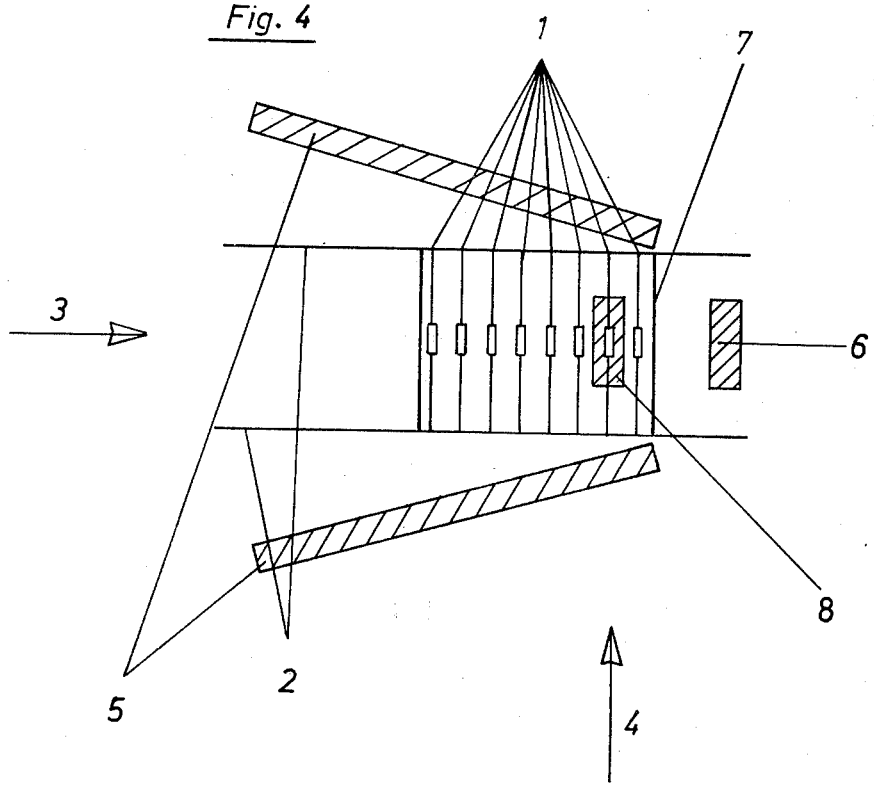
FIG. 4 is a top view of equipment comprising one guiding surface and hold magnets for improving the singling out or separating effect.

In many singling-out processes not only a small number of devices are to be separated from a large quantity of such devices, but in fact exactly each time only one individual device. For this purpose, and in further embodying the equipment according to the invention, the singling-out arrangement according to FIG. 2 may be improved in accordance with the showings of FIGS. 3 and 4. FIG. 3 shows the elevation, while FIG. 4 shows the top view. The equipment according to FIG. 4 corresponds to that of FIG. 2 with the exception, however, that now there has been provided an additional mechanical arrangement for guiding the devices 1 which, in this case, are again diodes, and with this arrangement consisting of a guiding surface 7 disposed at the transporting end vertically in relation to the sliding surfaces 2 and extending at a slight angle inclined in relation to the transporting direction 3. This guiding surface 7 cooperates with the inhomogeous magnetic field of the magnet plates of the magnet arrangement 5 in such a way that the devices 1 will collect at the transporting end 4 so as to be lying individually behind each other in one plane parallel in relation to the guiding surface 7.

In so doing, a further hold magnet 8 designed as an electromagnet, arranged and embodied in such a way that it — by correspondingly designing its pole shoes in the case of an electromagnet with an iron core — upon being energized, will preferably attract the device which is the last but one referred to the transporting magnet 6 and which, in turn, will weaken the stray field of the hold magnet 8 to such an extent that in the preferred type of embodiment no further devices can be attracted by the hold magnet 8. If, in addition thereto, there is energized the transporting magnet 6 which is operated in accordance with the coarse singling described above, merely the device lying closest thereto will be further moved in direction towards the transporting magnet 6. The following device is retained by the hold magnet 8; the devices which collect behind this hold magnet 8 are now stopped by the device which is lying in the second position.

Accordingly, by providing for an efficient time switching program of the magnets 6 and 8, e.g. in that first of all the hold magnet 8 and, thereafter, with a slight delay, the transporting magnet 6 are switched on until the frontmost device at the transporting end 4 has reached the transporting magnet 6, it is possible to exactly single one device out of the total number of devices.

3. Transporting with Fixing

Figure 5:
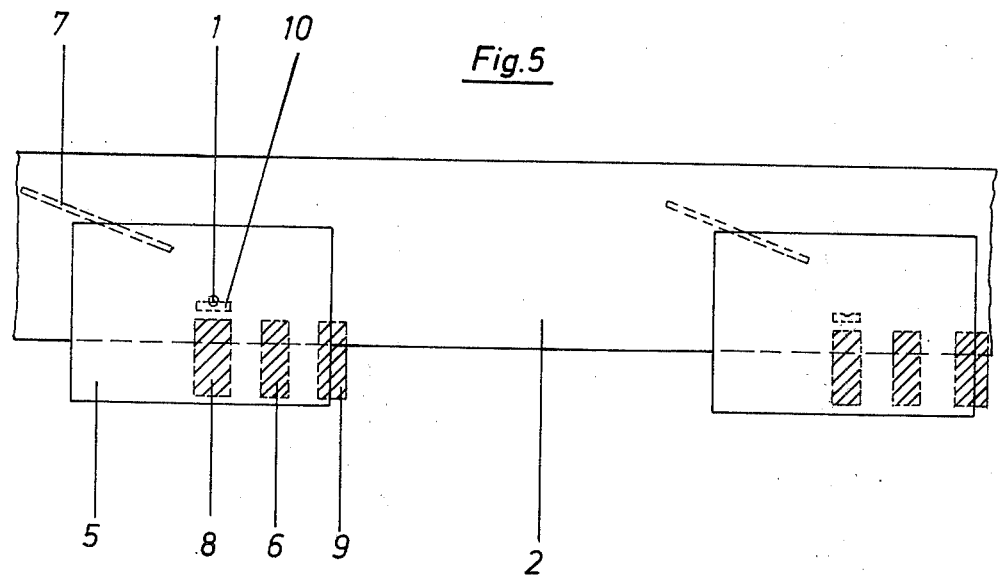
FIG. 5 is a side view.
Figure 6:
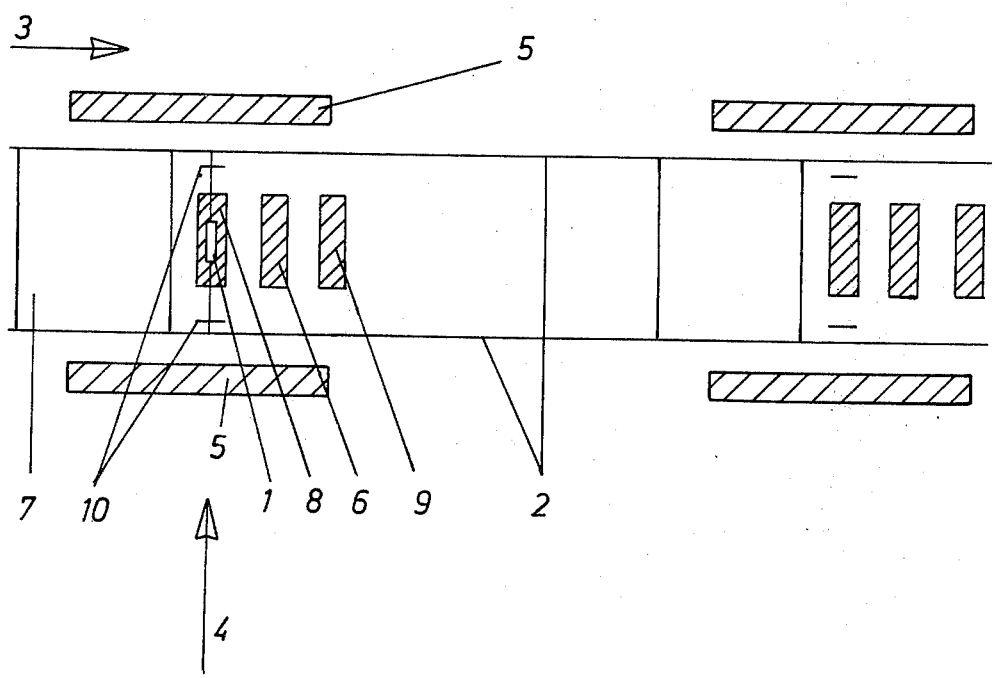
FIG. 6 is a top view of equipment according to the invention comprising a hold magnet for temporarily measuring or processing the devices.

A device which has already been singled, can be transported with the aid of chain-like arrangements according to FIG. 1, and temporarily fixed (stopped) inbetween for the purpose of being processed. On principle, this is already possible with the aid of an arrangement according to FIG. 2. A type of embodiment according to the invention improved for this purpose, is shown in an elevation in FIG. 5, and in a top view in FIG. 6, comprising two of an arbitrary number of series-arranged equipments according to the invention.

The device 1 which is a diode in the given example, in the equipment according to FIG. 1, may again be retained and aligned between two sliding surfaces 2 in an inhomogeneous magnetic field produced by the magnet plates of the magnet arrangement 5, having its field intensity maximum, for example, at point 4. The sliding surfaces 2 are appropriately designed to extend continuously between the individual transporting stations. In the given example, the magnets 8, 6 and 9 are arranged within such an equipment. Assuming now that a device 1 is inserted into the left-hand one of the two equipments in the transporting direction 3. If, at this particular time position, the hold magnet 8 is energized then, at a corresponding configuration of its magnetic field, it will attract this device, thus stopping the movement thereof. The hold effect may still be improved by providing for an additional suitable mechanical guiding of the device, in the example, by the guiding surface 7.

For the purpose of measuring the device 1 it is possible to provide at the hold magnet 8 a contact arrangement 10 for connecting the devices to an electrical measuring instrument. Alternatively, for effecting the processing, it is also possible to provide some device holding arrangements permitting the printing, lacquering, etc. Subsequently to the processing or measuring of the device 1, the hold magnet 8 is deenergized while the transporting magnet 6 and, if so required, also the electromagnet 9 are energized. The device 1 is preferably accelerated in the transporting direction 3 up to the point of maximum magnetic field intensity of the transporting magnet 6, thereafter the transporting magnet 6 is deenergized and, in the given example, a further electromagnet is energized until the device 1 has reached the point of maximum field intensity of this magnet. Owing to the acceleration given to it up to this time position, the device 1 may leave the inhomogeneous static field of the first equipment and is permitted to move further in the transporting direction 3 until being stopped by the action of a hold magnet which, if so required, follows in the next equipment. In this equipment, the aforementioned processs is repeated, so that the device 1 can be moved further with the aid of equipments embodied in accordance with the invention.

4. Fixing

This type of further embodiment of the equipment according to the invention is used in connection with production facilities continuously moving the devices to be processed, and which have already been singled out, with the aid of a mechanical holding arrangement, on a rotating belt, a disc, or the like. This movement prevents some processing operations from being carried out on the devices, such as the measuring of dynamic parameters in the case of electronic devices, because this often requires a geometrical arrangement which is kept constant during the measuring time, with short lead in conductors to a measuring circuit being required. It is the object of the described equipment, therefore, to separate the devices from the mechanical arrangement by which they are continuously moved, for fixing them in a spatial (geometrically) rigid position, and for feeding them again to the continuously moved arrangement after the processing operations have been carried out.

The set-up of such an equipment is shown in FIG. 7 in an elevation and in FIG. 8 in a top view. In FIG. 7 the device 1 is still shown in the handing over position 4 which is still to be described, and in FIG. 8 in the separating position 14. The singled-out device 1, in this case again a diode, is retained on a continuously moving arrangement, in the given example, on the rotating disc 11, preferably by magnetic, but equally well by pneumatic or mechanical forces, and thus on the holding arrangement 12 and is moved together therewith. Upon reaching the equipment substantially consisting of the one described with reference to FIG. 1, and which additionally still comprises a holding arrangement designed as a contact arrangement 10, the device is again separated from its holding arrangement 12 at the separating point 14.

This separating process may be effected with the aid of a mechanical stripper 13, but also by means of a separating device employing transporting magnets. Subsequently to the separation, the device 1 is in such a way attracted by the static inhomogeneous magnetic field produced by the magnet plates of the magnet arrangement that it, on the circumference of the disc 11, magnetically aligned between the sliding surfaces 2, will move quicker in the direction towards the hand-over point 4 lying preferably within the area of maximum magnetic field intensity, than its original holding arrangement 12. This process can be effected by the energization of a correspondingly designed transporting magnet 6. This magnet attracts the device 1 and presses it against a holding arrangement 10 at which either the processing operations or the measurements can be carried out. In the example of embodiment, the holding arrangement 10 consists of a contact assembly permitting the device 1 to be connected to an electrical measuring instrument. As soon as the holding arrangement 12 after a time delay determined by the circumferential speed of the disc, passes through the magnetic field as produced by the plates of the magnet arrangement 5, it will take over the device 1 subsequently to the deenergization of the transporting magnet 6 and by means of a corresponding constructional embodiment, at the hand-over point 4 for being further transported with the aid of the disc 11.

The entire process is illustrated by the line 22 indicating the path of motion relating to one individual device 1. While the device 1 is moved along this line from the separating point 14 via the holding arrangement 10 to the take-over point 4, the holding arrangement 12 moves from the separating point 14 directly to the take-over point 4.

5. Sorting

The equipment according to the invention as shown in FIG. 1 can be used for sorting magnetizable devices. For this purpose there is used a modification of the type of embodiment shown in FIGS. 5 and 6 as described under 3 above. One type of embodiment serving the sorting is shown in FIG. 9 in an elevation. This embodiment has been enlarged with respect to that of FIG. 5 by the transporting magnets 15 and 16 of a second transporting path, as well as by an additional mechanical guide, viz. the sliding surface 17.

After the device 1 which, in this case, is again a diode, has been inserted in the transporting direction 3 into the equipment according to the invention comprising the sliding surfaces 2 and the magnet plates of the magnet arrangement 5, it is fixed in position as in the type of embodiment according to FIG. 9, by the energization of the hold magnet 8, for performing an electrical measurement at the contacts of the holding arrangement 10. Subsequently to the deenergization of the hold magnet 8, the device 1 can be further transported via two different paths which are separated from one another by a mechanical guide, i.e. in the example by the sliding surface 17 arranged vertically in relation to the sliding surface 2. In so doing, one path extends via the transporting magnets 15 and 16 of the second transporting path and further in the transporting direction 3, and the second path extends via the transporting magnets 6 and 9 and, after any arbitrary deflection, in the example vertically in relation to the transporting direction 3, through the sliding surface 17 and further into the sorting-out direction 18. In the course of this the transporting magnets are energized in accordance with the description under 3 above.

Quite depending on the kind of devices to be sorted, the aforementioned basic principle of forming a switch or deflector with the aid of transporting magnets by using a handling equipment according to the invention permits of a great number of varieties.

6. Geometrical Alignment

In manufacturing processes the devices are often required to rotate in a certain manner about one of their axes so as to be capable of being processed in a desired geometrical position. This, for example, applies to diodes which have to be provided with a print in dependence upon their polarization. The handling equipment according to the invention is also suitable for solving such problems. In the most simple way this is possible by temporarily dividing the transporting path of the devices by means of a sorting unit as described under 5 above, and by providing in one of the two possible paths a body which is arranged and shaped in such a way that the device as moved past the body will perform a rotation in the desired sense, for being fed thereafter again to the common transporting path. Quite depending on which of the two possible paths is being chosen, the device, when passing the body, will either perform a certain rotation or no rotation at all.

Rotations about a desired axis and in a desired direction, however, can also be carried out in a purely magnetic manner with the aid of the handling equipment according to the invention. A corresponding example of embodiment is shown in FIG. 10 in a top view. On principle there is concerned the handling equipment as described under 3 above, comprising additional function elements for effecting the rotation of the device 1 which, in this case, is again a diode.

In the transporting direction 3, the device 1 is inserted into an equipment comprising the sliding surfaces 2 and a magnet arrangement 5 comprising magnet plates, and which preferably shows to have the maximum of the magnetic field intensity at the point indicated by the reference numeral 4. By energizing the hold magnet 8, the diode is caught at the holding arrangement 10 containing two measuring contacts for determining the polarity by means of an electrical measuring instrument. In dependence upon this polarity check, the device is first turned and then further transported, or else immediately further transported without performing a rotation. In so doing, the rotation is performed in such a way that subsequently to the deenergization of the hold magnet 8, the two electromagnets 19 and 20 are energized. These magnets are embodied in such a way that they, owing to the force of attraction of their magnetic field, will cause the diode to rotate about its own axis in the indicated direction of rotation 21. As soon as the two terminal wires of the diode have reached the field intensity maximum of the electromagnets 19 or 20, the latter are deenergized so that now the diode, owing to its mechanical inertia, and when given a sufficiently high acceleration, will perform a rotation by 180° with respect to the initial position, with it, until reaching a central position, having to overcome the force of the aligning field as produced by the magnet plates. Before a further transportation in the direction 3 can be effected, it is necessary, similar as in the description given under 3 above, that simultaneously the transporting magnets 6 and 20 are energized which, in connection with the electromagnet 9, will cause the device 1 to be accelerated to such an extent permitting it to leave the inhomogeneous magnetic field of the magnet arrangement 5.

Similar to the described equipment, it is possible with respect to magnetizable devices, to state numerous possibilities for effecting the geometrical alignment within the handling equipment according to the invention.

While the principles of the invention have been described above in connection with specific apparatus, it is to be clearly understood that this description is made only by way of example and not as a limitation on the scope of the invention.

What is claimed is:
1. An apparatus for handling devices consisting in part of a ferromagnetic material comprising:
   sliding means for guiding said devices;
   a first magnet arrangement producing a first steady inhomogeneous magnetic field whose intensity has a maximum value along the sliding means in the transporting direction and whose lines of force penetrate said sliding means generally vertically in relation to a surface of said sliding means, wherein the magnetic field of said first magnet arrangement first increases in the transporting direction of the devices and then decreases after having passed a maximum value at the end of said sliding means so that the devices will collect at one end of said sliding means;
   a switch; and
   at least one geometrically firmly arranged transporting electromagnet controlled by said switch and producing a second inhomogeneous magnetic field which overlaps said first magnetic field of said first magnet arrangement, said electromagnet capable of being switched in relation to time in such a way that said devices, when correspondingly dimensioning the magnet field and subsequent to their insertion on said sliding means, can be geometrically affected by said transporting electromagnet and wherein by weakening said second inhomogeneous magnetic field below a value necessary for pulling off additional devices, at least one device can be pulled off said end of said sliding means.

2. An apparatus according to claim 1 wherein said devices are geometrically affected by rotation.

3. An apparatus according to claim 1 wherein said devices are geometrically affected by further transportation out of the area of said apparatus, said transportation being accomplished by acceleration imparted by the electromagnet.

4. An apparatus according to claim 1 wherein said sliding means comprises two sliding surfaces arranged in a parallel spaced relation.

5. An apparatus according to claim 1 wherein said first magnet arrangement comprises two permanent-magnetic plates.

6. An apparatus according to claim 5 further including a plurality of transporting magnets controlled by said switch and arranged in such a way that said devices can be moved passed said transporting magnets in the transporting direction.

7. An apparatus according to claim 5 further comprising at least one switchable hold magnet for producing a third inhomogeneous magnetic field and arranged in such a way with respect to said sliding means that upon energization of said hold magnet, the flow of devices will be interrupted.

8. An apparatus according to claim 7 further comprising means for processing said devices while retained by said hold magnets.

9. An apparatus according to claim 5 further comprising at least two rows of switchable transporting magnets; and a switching unit for controlling the time and switch-on period of said transporting magnets in such a way as to provide for acceleration of said devices in a transporting direction along one of said rows of transporting magnets.

10. An apparatus according to claim 5 further comprising a plurality of rotary magnets individually capable of being switched for producing a magnetic field comprised of the overlapping of the magnetic fields of the individual rotary magnets, each controlled in such a way by time and switch-on period selection such that the devices will become geometrically aligned.

* * * * *